United States Patent
Ambroladze et al.

(10) Patent No.: US 9,086,990 B2
(45) Date of Patent: Jul. 21, 2015

(54) BITLINE DELETION

(71) Applicant: International Business Machines Corporation, Armonk, NY (US)

(72) Inventors: Ekaterina M. Ambroladze, Wappingers Falls, NY (US); Michael A. Blake, Wappingers Falls, NY (US); Michael Fee, Cold Spring, NY (US); Hieu T. Huynh, Austin, NY (US); Patrick J. Meaney, Poughkeepsie, NY (US); Arthur J. O'Neill, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 13/788,744

(22) Filed: Mar. 7, 2013

(65) Prior Publication Data
US 2013/0339809 A1    Dec. 19, 2013

Related U.S. Application Data (63) Continuation of application No. 13/523,633, filed on Jun. 14, 2012, now Pat. No. 8,788,891.

(51) Int. Cl.
| | |
|---|---|
| G06F 11/00 | (2006.01) |
| G11C 29/00 | (2006.01) |
| G06F 11/10 | (2006.01) |
| G06F 11/08 | (2006.01) |

(Continued)

(52) U.S. Cl.
CPC .......... *G06F 11/1064* (2013.01); *G06F 11/073* (2013.01); *G06F 11/076* (2013.01); *G06F 11/08* (2013.01); *G11C 2029/1204* (2013.01)

(58) Field of Classification Search
None
See application file for complete search history.

(56) References Cited

U.S. PATENT DOCUMENTS

| | | | |
|---|---|---|---|
| 5,748,543 A | 5/1998 | Lee et al. | |
| 7,626,869 B2 | 12/2009 | Wang et al. | |
| 7,734,966 B1 | 6/2010 | Lee et al. | |

(Continued)

FOREIGN PATENT DOCUMENTS

| | | |
|---|---|---|
| EP | 0494547 A2 | 7/1992 |
| JP | 2009295232 A | 12/2009 |
| KR | 2010088915 A | 8/2010 |

OTHER PUBLICATIONS

D. Henderson, et al., "IBM POWER6 Processor-Based Systems: Designed for Availabilty," Jun. 11, 2007; pp. 1-13.

*Primary Examiner* — Daniel McMahon
(74) *Attorney, Agent, or Firm* — Cantor Colburn LLP; Margaret McNamara (57) ABSTRACT

Embodiments relate to a computer system for bitline deletion, the system including a cache controller and cache. The system is configured to perform a method including detecting a first error when reading a first cache line, recording a first address of the first error, detecting a second error when reading a second cache line, recording a second address of the second error, comparing first and second bitline addresses, comparing the first and second wordline address, activating a bitline delete mode based on matching first and second bitline addresses and not matching first and second wordline addresses, detecting a third error when reading a third cache line, recording a third bitline address of the third error, comparing the second bitline address to the third bitline address and deleting a location corresponding to the third cache line based on the activated bitline delete mode and matching third and second bitline addresses.

14 Claims, 6 Drawing Sheets

(51) Int. Cl.
    *G06F 11/07*     (2006.01)
    *G11C 29/12*     (2006.01)

(56) References Cited

U.S. PATENT DOCUMENTS

| | | |
|---|---|---|
| 2002/0133760 A1 | 9/2002 | Ahrens et al. |
| 2005/0028039 A1 | 2/2005 | Henderson et al. |
| 2006/0239057 A1* | 10/2006 | Muller et al. ............ 365/63 |
| 2006/0248392 A1 | 11/2006 | Barlow et al. |
| 2008/0301530 A1 | 12/2008 | Spanel et al. |
| 2010/0268984 A1 | 10/2010 | Guthrie et al. |
| 2011/0280070 A1* | 11/2011 | Kim et al. ............ 365/185.03 |
| 2013/0117604 A1* | 5/2013 | Ha ............ 714/6.32 |

* cited by examiner

BITLINE DELETION

This application is a continuation of U.S. patent application Ser. No. 13/523,633, titled "BITLINE DELETION," filed Jun. 14, 2012, the disclosure of which is incorporated by reference herein in its entirety.

BACKGROUND

The present invention relates generally to memory in a computing system, and more specifically, to handling errors in memory.

Computer systems often have a considerable amount of cache and high speed random access memory (RAM) to hold information, such as data and programs, temporarily when a computer is powered and operational. This information is normally binary, composed of patterns of 1's and 0's known as bits of data. The bits of data are often grouped and organized at a higher level. A byte, for example, is typically composed of 8 bits; more generally these groups or bytes are called symbols and may consist of any number of bits or sub-symbols.

Memory device densities have continued to grow as computer systems have become more powerful. Unfortunately, the failure of just a portion of a memory device, such as a cache or RAM, can lead to significantly reduced performance. When memory errors occur, which may be "hard" (repeating) or "soft" (one-time or intermittent) failures, these failures may occur as single cell, multi-bit, wordline or bitlines and may cause all or part of the memory device to be unusable until it is repaired.

In the case of failures in a cache, a failure of a bitline is a hard error that causes errors each time a line that includes the failed bitline is accessed. In some cases, the failed bitline, in addition to a correctable error (CE) in the same line, will result in an uncorrectable two bit error (UE). Thus, cache performance is adversely affected by a failed bitline, as it may cause CEs that would ordinarily be quickly corrected by ECC to require additional processes to access the correct data or result in corrupted data.

SUMMARY

Embodiments include a method, system, and computer program product including detecting a first error when reading a first cache line in an array within a cache, recording a first bitline address and a first wordline address of the first error in the first cache line, detecting a second error when reading a second cache line in the array within the cache and recording a second bitline address and a second wordline address of the second error in the second cache line. Embodiments also include comparing the first bitline address to the second bitline address, comparing the first wordline address to the second wordline address, activating, by a cache controller, a bitline delete mode based on the first bitline address matching the second bitline address and the first wordline address not matching the second wordline address and detecting a third error when reading a third cache line in the array within the cache. Embodiments further include recording a third bitline address of the third error in the third cache line, comparing the second bitline address to a third bitline address of the third cache line and deleting, by the cache controller, a location corresponding to the third cache line from available cache locations based on the activated bitline delete mode and the third bitline address matching the second bitline address.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

In embodiments, the method, system and computer program product described herein improved bitline deletion following failure of a bitline in a memory device, such as a cache. In an embodiment, logic within cache hardware provides blocks to determine a bitline failure and to delete or remove the failed bitline from use in the cache. The embodiment deletes the failed bitline with improved accuracy and speed as compared to a system that is not configured to identify bitline failures. Errors that occur during reading or accessing of cache lines may be determined by a suitable technique, such as by using error correction codes (ECCs). The bitline address of the failed bit(s) in a line being read is compared to bitline addresses of the previous failed line, where a match of the failed bitline addresses causes a counter to increment only if the wordline address of the failed bit(s) in a line being read mismatches against wordline addresses of the previous failed line. When the counter reaches a selected threshold, a bitline delete mode is activated or enabled for the cache. Accordingly, a subsequent error that occurs during reading a selected cache line causes a comparison of the failed bitline address to the previous bitline address. In an embodiment, a match of the failed bitline addresses and the activated bitline delete mode causes deletion of the location of the selected cache from the cache directory, thus preventing further use of the selected cache line.

In an embodiment, a more aggressive operation would delete all lines from the cache directory that include the failed bitline as the number of errors reach a threshold, as determined by the comparisons and counter. In embodiments, the bitline address includes a set and syndrome of the failed bit in the wordline being accessed by the read request. Further, in one embodiment, the comparison of bitline addresses ignores the specific syndrome (e.g., bit) that failed and produces a match when the sets (also referred to as "compartments") match. In yet another embodiment with an appropriate memory device configuration, the bitline address compare only records and compares the syndrome or bit failure information. Accordingly, a match results when a specific syndrome, regardless of set, has repeated failures when accessing the cache. In addition, after detecting each error, the erroneous contents of the cache location are cleared and the correct information, which was expected to be in the location, is accessed from another location in memory, such as a higher level (closer to main memory) location.

Figure 1:
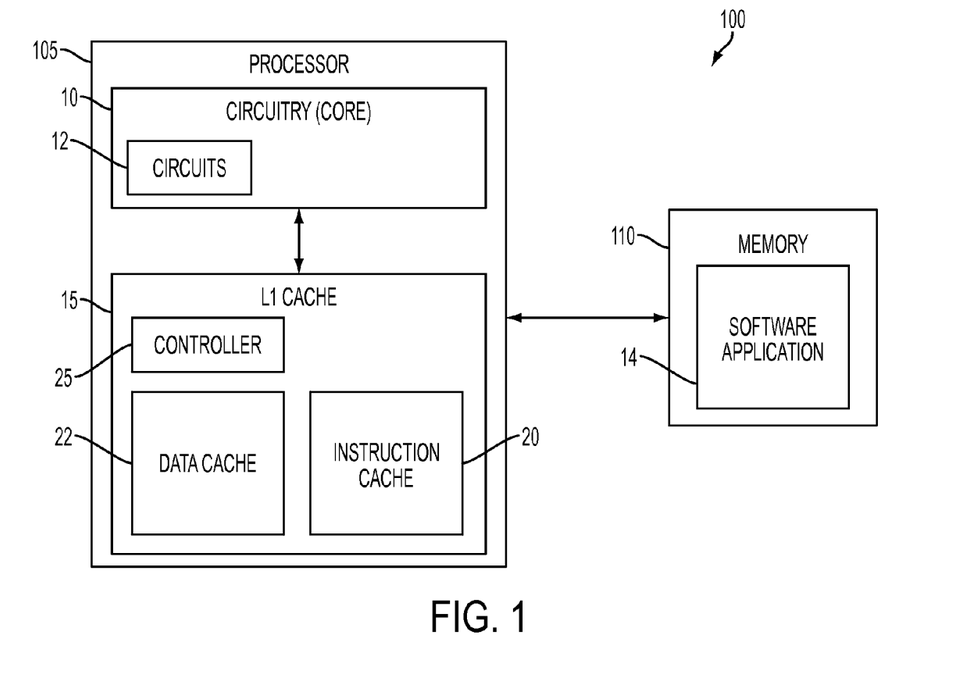
FIG. 1 illustrates a block diagram of a computing system for storing and retrieving data in a memory in accordance with an embodiment of the present invention.

Turning now to FIG. 1, a block diagram of a system 100 is generally shown according to an embodiment. The system 100 includes a processor 105. The processor 105 has one or more processor cores, and the processor core may be referred to as circuitry 10. The processor 105 may include a level one (L1) cache 15. Although an L1 cache is shown, exemplary embodiments may be implemented in any suitable cache, such as L1 cache, L2 cache and L3 cache, as desired. The L1 cache 15 includes an L1 data cache 22 (D-cache) and an L1 instruction cache 20 (I cache). In an embodiment, the data cache 22 is on-processor (hardware) memory for caching (i.e., storing) data on the processor 105. Data retrieved from memory 110 may be cached in the data cache 22 while instructions of program code 115 retrieved from the memory 110 may be cached in the instruction cache 20 (e.g., on-processor, hardware, memory). A controller 25 is configured to control accessing and management of the cache. Embodiments of the request prioritization may occur in the data cache 22 and/or instruction cache 20.

The circuits 12 may be application specific integrated circuits (ASIC), field programmable gate arrays (FPGA), etc. Also, additional operations or logic may be implemented as software code illustrated as a software application 14.

Figure 2:
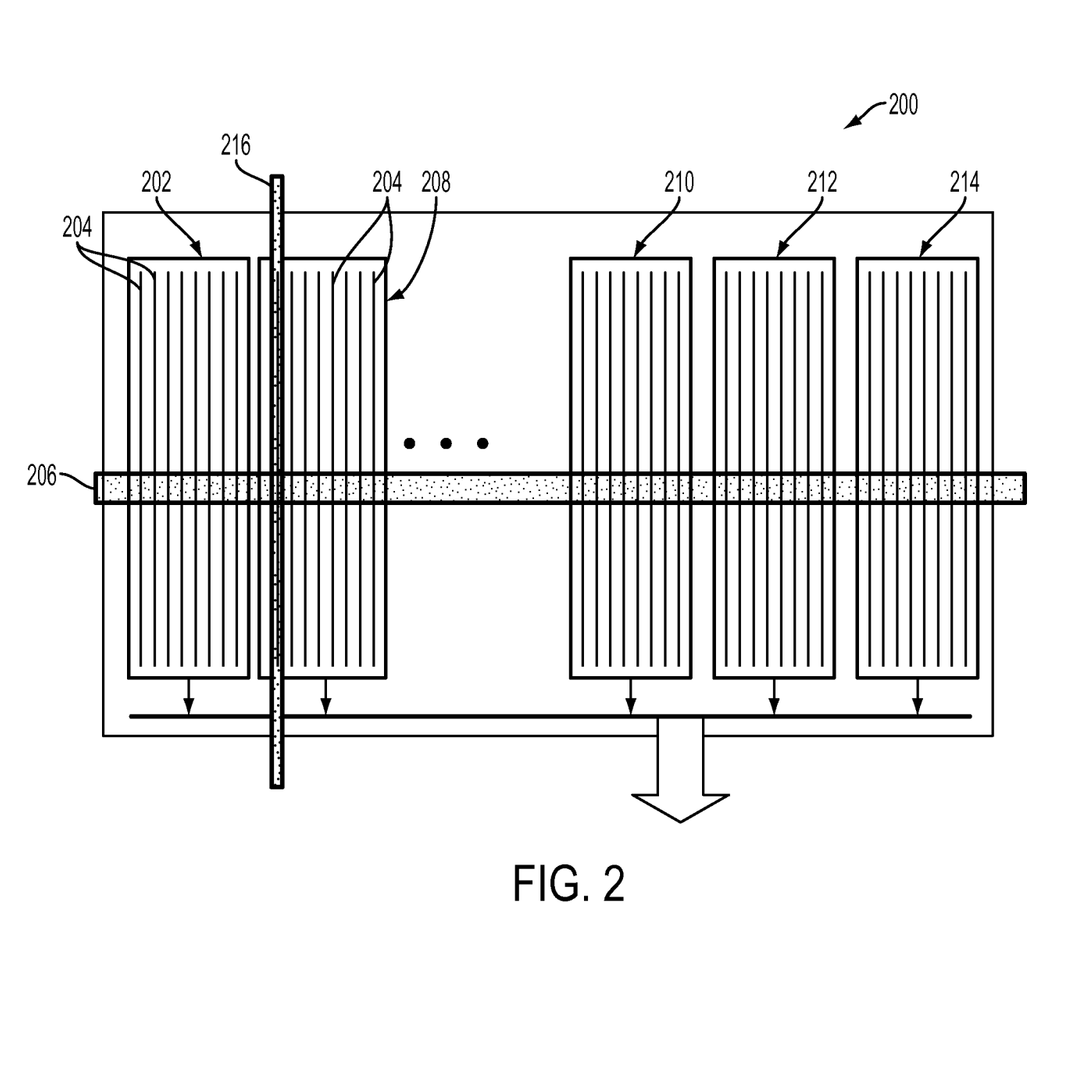
FIG. 2 illustrates a diagram of a cache memory utilizing a bitline monitoring and deletion process in accordance with an embodiment of the present invention.

The cache 200 is organized into a plurality of sets 202, 208, 210, 212 and 214, where each set includes a plurality of bitlines 204.

FIG. 2 is a schematic diagram of an exemplary cache 200 memory utilizing a bitline monitoring and deletion process. In an embodiment, the cache 200 is organized into a plurality of blocks 202, 208, 212 and 214, where each block includes a plurality of bitlines 204. In one example, bits in the first bitline 204 of each block may be read together as a set when accessing a wordline 206. As depicted, the wordline 206 is a word or "row" including a plurality of sets each set including a plurality of bits in bitlines 204. In an embodiment, each bitline 204 location within a block corresponds to a syndrome. Thus, in an embodiment, a bitline address corresponds to a selected bitline 204 in a selected set. In an embodiment, when accessing a specific line within a wordline 206 of the cache 200, a set is specified in addition to the wordline 206. When a bitline failure occurs, such as in bitline 216, an error will result each time the set that includes bitline 216 is accessed. The error may be considered a hard error because the error persists over time. An error checking process, such as an error correction code (ECC), may be used to detect and correct the error(s), however the process may be limited in detecting and correcting a plurality of errors in a line. Therefore, a soft error, which is ordinarily correctable, may not be corrected, due to the additional error caused by the bitline 216 failure where the ECC cannot correct a plurality of errors in a line. In embodiments, the data bits, sets and blocks may be arranged and accessed in any suitable manner, depending on application criteria.

Figure 3:
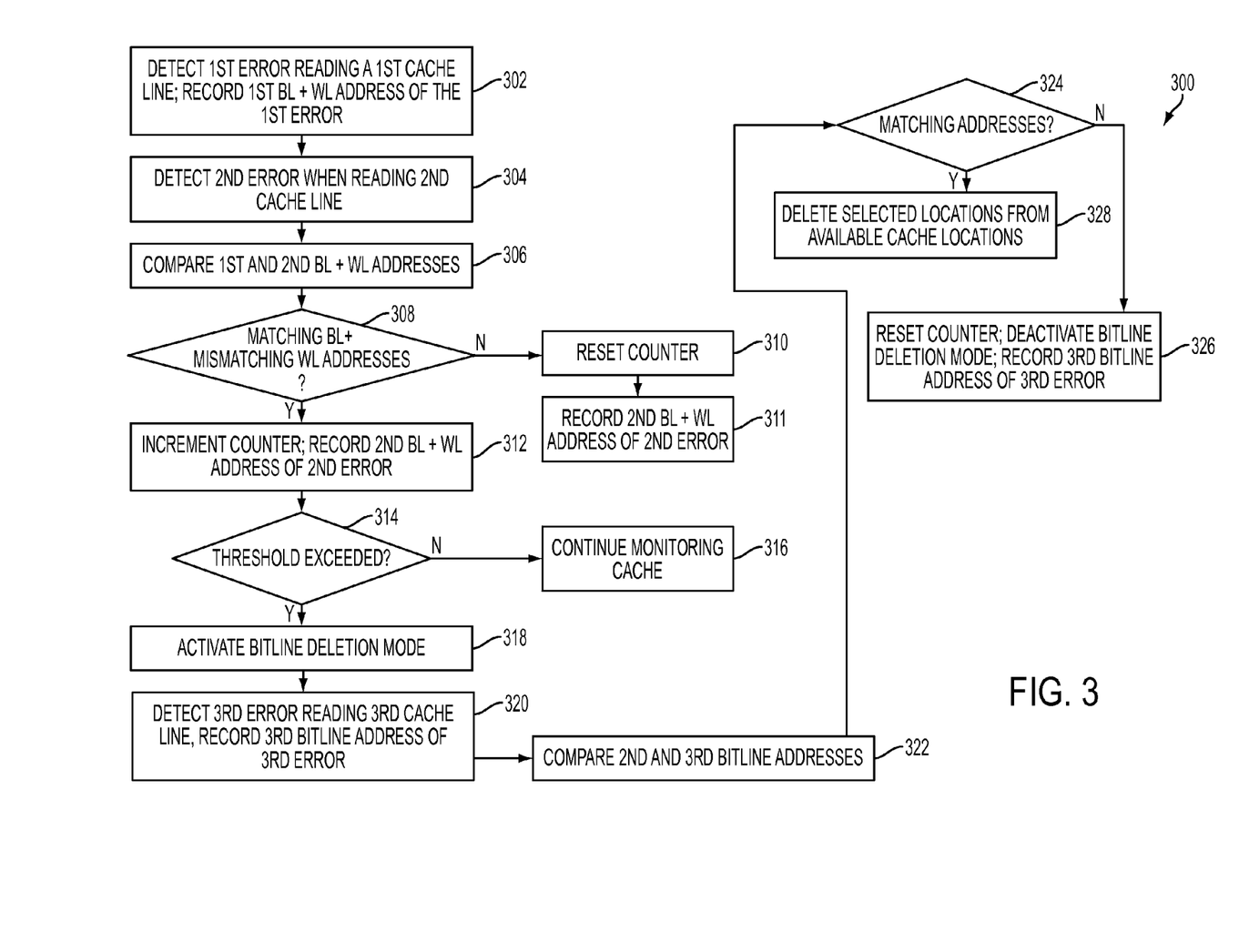
FIG. 3 illustrates a flow diagram of a method and system for detecting and deleting failing bitlines in a cache in accordance with an embodiment of the present invention.

FIG. 3 is an exemplary flow diagram 300 of a method and system for detecting and deleting failing bitlines in a cache, such as cache 200. The method and system may be implemented in logic in cache hardware, in firmware and/or in software. In block 302, a first error is detected when reading a first cache line of a cache. A first bitline address of the first error is then recorded in a suitable location, such as a register. In block 304, a second error is detected when reading a second cache line of the cache. In block 306, the bitline and wordline addresses of the second error are compared to the bitline and wordline addresses of the first error. If the first and second bitline addresses do not match in block 308, a bitline error counter is reset, set to zero, or remains at zero, as depicted in block 310. In block 311, the second address, including the bitline and wordline address, corresponding to the second error is recorded in a suitable location, such as in the register. In block 312, the bitline error counter is incremented when first and second bitline addresses are matched and the wordline addresses between first and second bitline are non-matching. In addition, the second bitline and wordline addresses corresponding to the second error are recorded, such as in the register. In block 314, the value of the bitline error counter is compared to a threshold. In block 316, if the bitline error counter is not greater than the threshold, cache operations continue to be monitored. Accordingly, a subsequent error detected during a cache line read may lead to block 302, where consecutive errors with matching bitline addresses cause the counter value to be greater than the threshold.

If the bitline error counter exceeds the threshold in block 314, a bitline delete mode is activated for the cache, as depicted in block 318. In block 320, a third error is detected when reading a third cache line in the cache. In block 322, the second and third bitline addresses, corresponding to the second and third errors, are compared. If the second and third bitline addresses do not match in block 324, the bitline error counter is reset and bitline delete mode is deactivated, as depicted in block 326. Further, the third bitline address corresponding to the third error is recorded and the cache continues to be monitored. If the second and third bitline addresses do match in block 324, selected locations are deleted from available cache locations in block 328. In addition, the third bitline address corresponding to the third error is recorded, such as in the register. Since only the bitline addresses are being checked, subsequent matching bitline errors cause deletion of matching lines from available cache locations regardless of the wordline address of the errors. For example, the third cache line may be deleted from the cache directory by being marked within the cache directory as unavailable. In another embodiment, a section of lines are deleted from the cache directory, where the section includes all lines that include the second and third bitline address (i.e. the failed bitline address). In an embodiment, the corrected information in the third cache line is copied to a higher level memory that is located further from a processor or core that is coupled to the cache. Further, as part of the delete process the location corresponding to the third cache line is marked as unusable.

It should be noted that in one embodiment, the first, second and third errors are consecutive errors experienced at any time by the cache, where the bitline detection and deletion process is configured to improve bitline failure detection and cache performance. In another embodiment, the first, second and third errors are not consecutive errors, where a time of the errors is recorded and a threshold determination incorporates a timing aspect (e.g., threshold being four errors in a 20 hour time period). Embodiments may utilize any suitable hardware or logic for implementation, such as using a latch as the counter. For example, the latch may be a bitline error seen latch whose value is changed or set on a cycle (in hardware logic) to indicate that a selected number (e.g., two) of consecutive errors have matching bitline addresses and non-matching wordline addresses. Accordingly, the latch indicates a "compare seen" after two consecutive matching bitline addresses and non-matching wordline addresses (i.e., a static threshold is equal to two) cause cache errors. Thus, when a third error has a matching bitline address, bitline delete mode is activated and a location corresponding to the current cache line is deleted from the cache directory. In addition, subsequent errors with matching bitline addresses "see" the activated or set latch indicating the bitline delete mode because the previous two bitline addresses matched, thus continuing bitline deletion until the latch is reset. The latch may be reset when consecutive errors have bitline addresses that are non-matching. Therefore, in the embodiment, the latch acts as a counter with a static threshold that sets a bit when a previous comparison resulted in a match. In an embodiment, the bitline address comparison in blocks 306 and 322 is a comparison of the set and syndrome of the error. In another embodiment, the bitline address comparison in blocks 306 and 322 is a comparison of the set of the error, where the syndrome in the set is ignored and the counter is incremented based on a match of sets. Thus, bitline delete mode is activated based on monitoring only sets. In yet another embodiment, the bitline address comparison in blocks 306 and 322 is a comparison of the syndrome of the error, where the set is ignored and the counter is incremented based on a match of syndromes. Thus, bitline delete mode is activated based on monitoring only syndromes. The implementation of bitline address comparison may depend on memory architecture and other system constraints.

Figure 4:
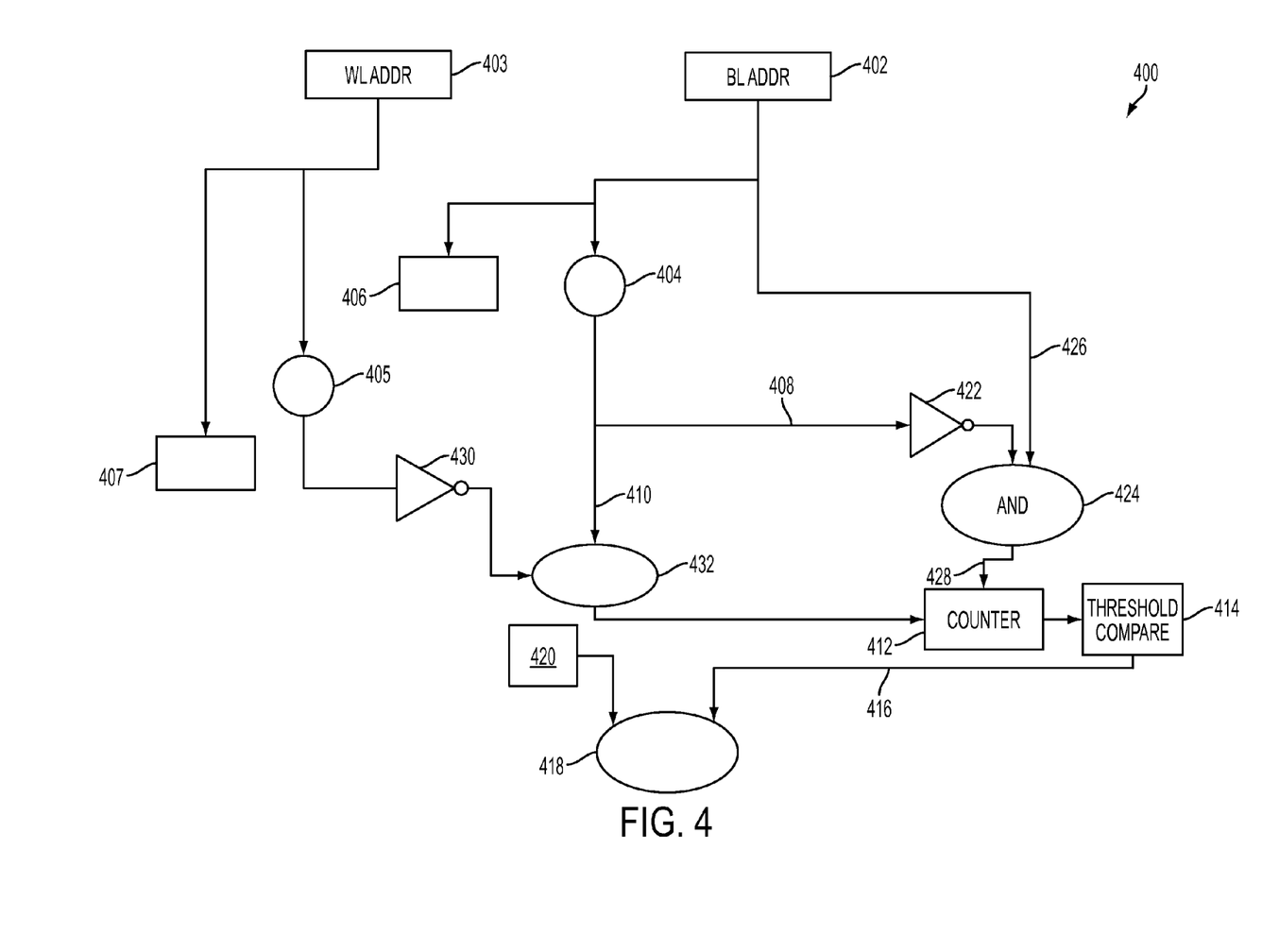
FIG. 4 illustrates a diagram of a system, process and logic for implementing bitline detection and deletion in accordance with an embodiment of the present invention.

FIG. 4 is a diagram of an exemplary system and logic 400 for implementing bitline detection and deletion. In the logic, a cache receives an address that caused an error during a cache read operation, where the address includes a bitline address in block 402 and a wordline address 403. In block 404, the bitline address is compared to a previously recorded bitline address to determine if the errors have matching bitline addresses. The previously recorded bitline address corresponds to the bitline address of a previous cache line error that has been recorded in a register 406. In an embodiment, after the comparison in block 404, the current bitline address of the read error is recorded in the register 406. In block 405, the wordline address from block 403 is compared to a previously recorded wordline address to determine if the errors have matching wordline addresses. The previously recorded wordline address corresponds to the wordline address of a previous cache line error that has been recorded in a register 407. In an embodiment, after the comparison in block 405, the current wordline address of the read error is recorded in the register 407. In block 430, the comparison block 405 output is inverted to provide a "yes" signal if the wordline addresses are non-matching addresses.

The output from block 430 and output 410 are received by "and" function block 432, where a counter 412 is only incremented when non-matching wordline address and a matching bitline address result from the comparison to a prior error. A value of the counter 412 is then compared in block 414 to a threshold value to determine if a bitline delete mode is activated. If the value of the counter 412 is greater than the threshold value, the bitline delete mode is activated and an input 416 indicates to enable bitline deletion for subsequent read errors with matching bitline addresses, as depicted by block 418. In an embodiment, the subsequent read errors cause line deletion regardless of a wordline address of the errors. If the value of the counter 412 is higher than the threshold value, the bitline delete mode has already been activated and an input 416 indicates to enable bitline deletion for the reported error at block 402. In other embodiments, the bitline delete mode may be activated if the counter 412 value is equal to the threshold. Other logic or systems, represented by block 420, may also be used to determine cache line address failures that cause locations corresponding to failed lines to be deleted from cache directory. Thus, block 418 is an "or" function block, where either input received causes bitlines to be deleted from available cache locations. Returning to the compare block 404, if the bitline address comparison does not result in a match, an input 408 is received by an inverter 422. The inverter 422 receives the input 408 which indicates there was "not" a compare (i.e., the bitline addresses did not match). In addition, the inverter 422 output is received, along with a valid signal 426, by "and" function block 424. The valid signal 426 received by "and" function block 424 is a gating input that indicates the value of the compare input 408 is valid and may be used to reset the counter 412 by reset input 428. The depicted embodiment is one example of how to implement bitline error detection and deletion and may have different, fewer and/or additional blocks, depending upon system and application requirements. In an embodiment, the logic is implemented by a cache controller, which may be control logic provided in hardware.

Figure 5:
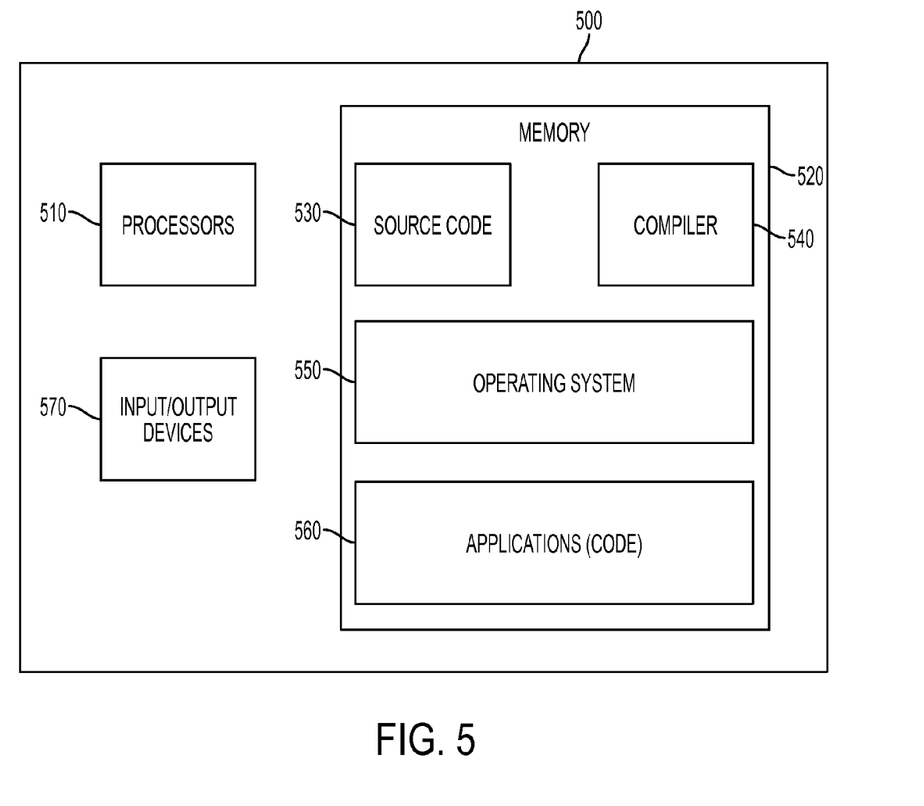
FIG. 5 illustrates an example of a computer having capabilities, which may be utilized in accordance with an embodiment of the present invention.

FIG. 5 illustrates an example of a computer 500 having capabilities, which may be included in exemplary embodiments. Various methods, procedures, modules, flow diagrams, tools, application, circuits, elements, and techniques discussed herein may also incorporate and/or utilize the capabilities of the computer 500. Moreover, capabilities of the computer 500 may be utilized to implement features of exemplary embodiments discussed herein. One or more of the capabilities of the computer 500 may be utilized to implement, to connect to, and/or to support any element discussed herein (as understood by one skilled in the art) in FIGS. 1-4 and 6.

Generally, in terms of hardware architecture, the computer 500 may include one or more processors 510, computer readable storage memory 520, and one or more input and/or output (I/O) devices 570 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 510 is a hardware device for executing software that can be stored in the memory 520. The processor 510 can be virtually any custom made or commercially available processor, a central processing unit (CPU), a data signal processor (DSP), or an auxiliary processor among several processors associated with the computer 500, and the processor 510 may be a semiconductor based microprocessor (in the form of a microchip) or a macroprocessor.

The computer readable memory 520 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 520 may incorporate electronic, magnetic, optical, and/or other types of storage media. Note that the memory 520 can have a distributed architecture, where various components are situated remote from one another, but can be accessed by the processor 510.

The software in the computer readable memory 520 may include one or more separate programs, each of which comprises an ordered listing of executable instructions for implementing logical functions. The software in the memory 520 includes a suitable operating system (O/S) 550, compiler 540, source code 530, and one or more applications 560 of the exemplary embodiments. As illustrated, the application 560 comprises numerous functional components for implementing the features, processes, methods, functions, and operations of the exemplary embodiments. The application 560 of the computer 500 may represent numerous applications, agents, software components, modules, interfaces, controllers, etc., as discussed herein but the application 560 is not meant to be a limitation.

The operating system 550 may control the execution of other computer programs, and provides scheduling, input-output control, file and data management, memory management, and communication control and related services.

The application(s) 560 may employ a service-oriented architecture, which may be a collection of services that communicate with each. Also, the service-oriented architecture allows two or more services to coordinate and/or perform activities (e.g., on behalf of one another). Each interaction between services can be self-contained and loosely coupled, so that each interaction is independent of any other interaction.

Further, the application 560 may be a source program, executable program (object code), script, or any other entity comprising a set of instructions to be performed. When a source program, then the program is usually translated via a compiler (such as the compiler 540), assembler, interpreter, or the like, which may or may not be included within the memory 520, so as to operate properly in connection with the O/S 550. Furthermore, the application 560 can be written as (a) an object oriented programming language, which has classes of data and methods, or (b) a procedure programming language, which has routines, subroutines, and/or functions.

The I/O devices 570 may include input devices (or peripherals) such as, for example but not limited to, a mouse, keyboard, scanner, microphone, camera, etc. Furthermore, the I/O devices 570 may also include output devices (or peripherals), for example but not limited to, a printer, display, etc. Finally, the I/O devices 570 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 570 also include components for communicating over various networks, such as the Internet or an intranet. The I/O devices 570 may be connected to and/or communicate with the processor 510 utilizing Bluetooth connections and cables (via, e.g., Universal Serial Bus (USB) ports, serial ports, parallel ports, FireWire, HDMI (High-Definition Multimedia Interface), etc.).

When the computer 500 is in operation, the processor 510 is configured to execute software stored within the memory 520, to communicate data to and from the memory 520, and to generally control operations of the computer 500 pursuant to the software. The application 560 and the O/S 550 are read, in whole or in part, by the processor 510, perhaps buffered within the processor 510, and then executed.

When the application 560 is implemented in software it should be noted that the application 560 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 560 can be embodied in any computer-readable medium 520 for use by or in connection with an instruction execution system, apparatus, server, or device, such as a computer-based system, processor-containing system, or other system that can fetch the instructions from the instruction execution system, apparatus, or device and execute the instructions. In the context of this document, a "computer-readable storage medium" can be any means that can store, read, write, communicate, or transport the program for use by or in connection with the instruction execution system, apparatus, or device. The computer readable medium can be, for example but not limited to, an electronic, magnetic, optical, or semiconductor system, apparatus, or device.

More specific examples (a nonexhaustive list) of the computer-readable medium 520 would include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical).

In exemplary embodiments, where the application 560 is implemented in hardware, the application 560 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 500 includes non-limiting examples of software and hardware components that may be included in various devices, servers, and systems discussed herein, and it is understood that additional software and hardware components may be included in the various devices and systems discussed in exemplary embodiments.

Figure 6:
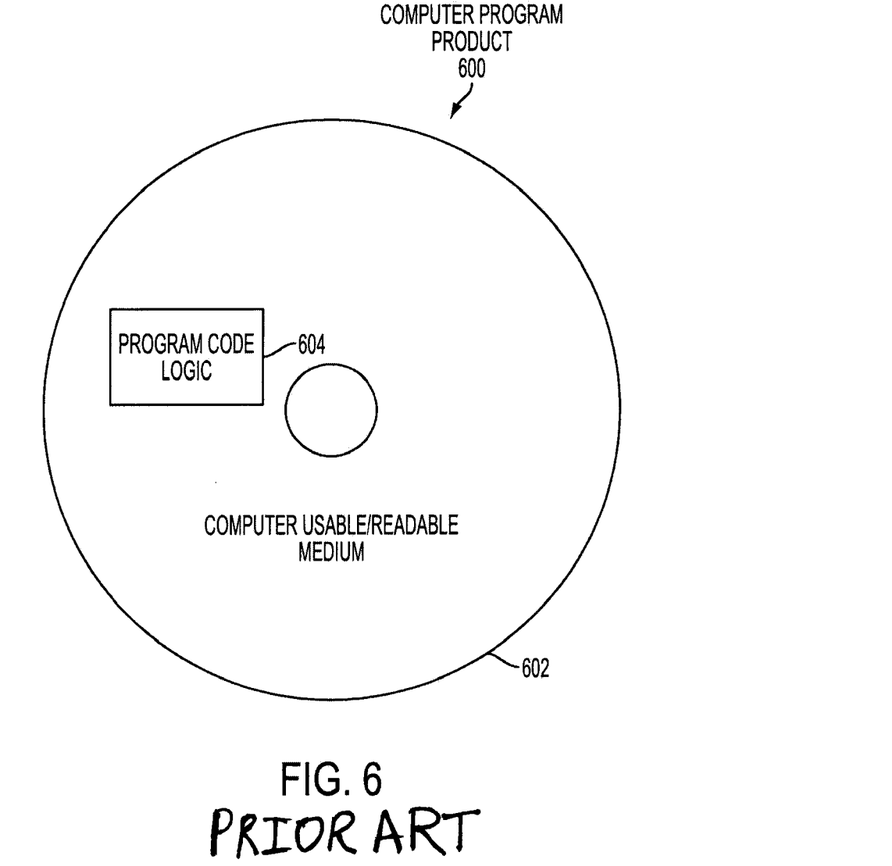
FIG. 6 illustrates an example of a computer program product on a computer readable/usable medium with computer program code logic embodied in tangible media as an article of manufacture.

As described above, embodiments can be embodied in the form of computer-implemented processes and apparatuses for practicing those processes. An embodiment may include a computer program product 600 as depicted in FIG. 6 on a computer readable/usable medium 602 with computer program code logic 604 containing instructions embodied in tangible media as an article of manufacture. Exemplary articles of manufacture for computer readable/usable medium 602 may include floppy diskettes, CD-ROMs, hard drives, universal serial bus (USB) flash drives, or any other computer-readable storage medium, wherein, when the computer program code logic 604 is loaded into and executed by a computer, the computer becomes an apparatus for practicing the invention. Embodiments include computer program code logic 604, for example, whether stored in a storage medium, loaded into and/or executed by a computer, or transmitted over some transmission medium, such as over electrical wiring or cabling, through fiber optics, or via electromagnetic radiation, wherein, when the computer program code logic 604 is loaded into and executed by a computer, the computer becomes an apparatus for practicing the invention. When implemented on a general-purpose microprocessor, the computer program code logic 604 segments configure the microprocessor to create specific logic circuits.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Referring now to FIG. 6, in one example, a computer program product 600 includes, for instance, one or more storage media 602, wherein the media may be tangible and/or non-transitory, to store computer readable program code means or logic 604 thereon to provide and facilitate one or more aspects of embodiments described herein.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

Embodiments include a method, system, and computer program product including detecting a first error when reading a first cache line in an array within a cache, recording a first bitline address and a first wordline address of the first error in the first cache line, detecting a second error when reading a second cache line in the array within the cache and recording a second bitline address and a second wordline address of the second error in the second cache line. Embodiments also include comparing the first bitline address to the second bitline address, comparing the first wordline address to the second wordline address, activating, by a cache controller, a bitline delete mode based on the first bitline address matching the second bitline address and the first wordline address not matching the second wordline address and detecting a third error when reading a third cache line in the array within the cache. Embodiments further include recording a third bitline address of the third error in the third cache line, comparing the second bitline address to a third bitline address of the third cache line and deleting, by the cache controller, a location corresponding to the third cache line from available cache locations based on the activated bitline delete mode and the third bitline address matching the second bitline address.

In an embodiment, activating, by the cache controller, the bitline delete mode includes incrementing a bitline error counter based on the first bitline address matching the second bitline address and activating the bitline delete mode based on the bitline error counter being greater than or equal to a bitline delete threshold. In an embodiment, the bitline error counter is reset based on a non-matching result from the comparing of the second bitline address to the third bitline address. In an embodiment, incrementing, by the cache controller, the bitline error counter includes incrementing a bitline error seen latch and wherein the bitline delete threshold includes a static threshold that changes a value of the bitline error seen latch. In an embodiment, deleting, by the cache controller, the location corresponding to the third cache line from available cache locations includes deleting the location regardless of a wordline address of the third cache line. In an embodiment, the first error, second error and third error are consecutive cache line read errors. In an embodiment, deleting, by the cache controller, the location corresponding to the third cache line from available cache locations includes deleting a section of the cache from a cache directory, the section including a plurality of lines including the third cache line. In an embodiment, the method further includes copying the third cache line from the cache to a higher level memory located further from a processor coupled to the cache.

Technical effects and benefits include improved memory performance due to enhanced bitline deletion following failure of a bitline in a memory device. In an embodiment, logic within cache hardware provides blocks to determine a bitline failure and to delete or remove the failed bitline from use in the cache. Embodiments provide improved memory performance by removing lines and/or sections of memory corresponding to the failed bitline from a directory in an accelerated fashion, thus enabling the memory system to detect and correct other errors (e.g., soft errors) that may not be corrected when failed bitlines are remain available.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer program product for bitline deletion, the computer program product comprising:
    a tangible, non-transitory storage medium readable by a processing circuit and storing instructions for execution by the processing circuit for performing a method comprising:
    detecting a first error when reading a first cache line in an array within a cache;
    recording a first bitline address and a first wordline address of the first error in the first cache line;
    detecting a second error when reading a second cache line in the array within the cache;
    recording a second bitline address and a second wordline address of the second error in the second cache line;
    comparing the first bitline address to the second bitline address;
    comparing the first wordline address to the second wordline address;
    activating, by a cache controller, a bitline delete mode based on the first bitline address matching the second bitline address and the first wordline address not matching the second wordline address;
    detecting a third error when reading a third cache line in the array within the cache;
    recording a third bitline address of the third error in the third cache line;
    comparing the second bitline address to the third bitline address of the third cache line; and
    removing, by the cache controller, a location corresponding to the third cache line from available cache locations based on the bitline delete mode being activated and the third bitline address matching the second bitline address.

2. The computer program product of claim 1, wherein activating, by the cache controller, the bitline delete mode comprises:
    incrementing a bitline error counter based on the first bitline address matching the second bitline address and the first wordline address not matching the second wordline address; and
    activating the bitline delete mode based on the bitline error counter being greater than or equal to a bitline delete threshold.

3. The computer program product of claim 2, wherein the bitline error counter is reset based on a non-matching result from the comparing of the second bitline address to the third bitline address.

4. The computer program product of claim 2, wherein incrementing, by the cache controller, the bitline error counter comprises setting a bitline error seen latch and wherein the bitline delete threshold comprises a static threshold that changes a value of the bitline error seen latch.

5. The computer program product of claim 1, wherein removing, by the cache controller, the location corresponding to the third cache line from available cache locations comprises removing a section of the cache from a cache directory, the section including a plurality of lines including the third cache line.

6. The computer program product of claim 1, wherein removing, by the cache controller, the location corresponding to the third cache line from available cache locations comprises removing a section of the cache from a cache directory, the section including a plurality of lines including the third cache line.

7. A computer system for bitline deletion, the system comprising:
a cache controller and a cache, the system configured to perform a method comprising:
detecting a first error when reading a first cache line in an array within a cache;
recording a first bitline address and a first wordline address of the first error in the first cache line;
detecting a second error when reading a second cache line in the array within the cache;
recording a second bitline address and a second wordline address of the second error in the second cache line;
comparing the first bitline address to the second bitline address;
comparing the first wordline address to the second wordline address;
activating, by a cache controller, a bitline delete mode based on the first bitline address matching the second bitline address and the first wordline address not matching the second wordline address;
detecting a third error when reading a third cache line in the array within the cache;
recording a third bitline address of the third error in the third cache line;
comparing the second bitline address to the third bitline address of the third cache line; and
removing, by the cache controller, a location corresponding to the third cache line from available cache locations based on the bitline delete mode being activated and the third bitline address matching the second bitline address.

8. The system of claim 7, wherein activating, by the cache controller, the bitline delete mode comprises:
incrementing a bitline error counter based on the first bitline address matching the second bitline address and the first wordline address not matching the second wordline address; and
activating the bitline delete mode based on the bitline error counter being greater than or equal to a bitline delete threshold.

9. The system of claim 8, wherein the bitline error counter is reset based on a non-matching result from the comparing of the second bitline address to the third bitline address.

10. The system of claim 8, wherein incrementing, by the cache controller, the bitline error counter comprises setting a bitline error seen latch and wherein the bitline delete threshold comprises a static threshold that changes a value of the bitline error seen latch.

11. The system of claim 7, wherein removing, by the cache controller, the location corresponding to the third cache line from available cache locations comprises removing the location regardless of a wordline address of the third cache line.

12. The system of claim 7, wherein the first error, second error and third error are consecutive cache line read errors.

13. The system of claim 7, wherein deleting, by the cache controller, the location corresponding to the third cache line from available cache locations comprises deleting a section of the cache from a cache directory, the section including a plurality of lines including the third cache line.

14. The system of claim 7, comprising copying the third cache line from the cache to a higher level memory located further from a processor coupled to the cache.

\* \* \* \* \*